(12) United States Patent
Chen et al.

(10) Patent No.: US 6,914,759 B2
(45) Date of Patent: Jul. 5, 2005

(54) GIANT MAGNETORESISTIVE SENSOR HAVING SELFCONSISTENT DEMAGNETIZATION FIELDS

(75) Inventors: Lujun Chen, Eden Prairie, MN (US); James H. Giusti, Chanhassen, MN (US); Juan J. Fernandez-de-Castro, Lakeville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 381 days.

(21) Appl. No.: 09/843,370

(22) Filed: Apr. 26, 2001

(65) Prior Publication Data

US 2002/0034056 A1 Mar. 21, 2002

Related U.S. Application Data

(63) Continuation of application No. PCT/US01/13417, filed on Apr. 26, 2001.
(60) Provisional application No. 60/233,815, filed on Sep. 19, 2000.

(51) Int. Cl.[7] .............................................. G11B 5/39
(52) U.S. Cl. ...................................... 360/324; 324/252
(58) Field of Search ........................... 360/324, 324.12, 360/327.23, 327.31, 327.32; 324/207.21, 252; 338/32 R, 32 H

(56) References Cited

U.S. PATENT DOCUMENTS

| | | | |
|---|---|---|---|
| 4,949,039 A | 8/1990 | Grünberg | 324/252 |
| 5,206,590 A | 4/1993 | Dieny et al. | 324/252 |
| 5,301,079 A | 4/1994 | Cain et al. | 360/113 |
| 5,452,163 A | 9/1995 | Coffey et al. | 360/113 |
| 5,475,304 A | 12/1995 | Prinz | 324/207.21 |
| 5,534,355 A | 7/1996 | Okuno et al. | 428/611 |
| 5,549,978 A | 8/1996 | Iwasaki et al. | 428/692 |

(Continued)

FOREIGN PATENT DOCUMENTS

| | | |
|---|---|---|
| EP | 0 702 357 A2 | 9/1994 |
| EP | 0 675 371 A2 | 10/1995 |
| JP | 10-320717 | 12/1998 |
| JP | 11-25430 | 1/1999 |

OTHER PUBLICATIONS

"Linearity of Unshielded Spin–Valve Sensors", by N. Sugaware et al., *American Institute of Physics*, 1997, 3 pages.
"AMR Effect in Spin–Valve Structure", by Y. Uehara et al., *IEEE Transactions on Magnetics*, vol. 32, No. 5, Sep. 1996, pp. 3432–3433.
U.S. Appl. No. 60/233,815, filed Sep. 19, 2000 by Lujun Chen, Jim Giusti and Juan Fernandez–de–Castro, entitled New MR Reader Structures Based on Stray & Demag Fields with Downward External Field.

*Primary Examiner*—Brian E. Miller
(74) *Attorney, Agent, or Firm*—Westman, Champlin & Kelly

(57) ABSTRACT

The present invention is directed to a spin valve sensor for use in a data storage system, that is adapted to receive a sense current and produce a GMR effect in response to applied magnetic fields. The spin valve sensor includes first and second ferromagnetic free layers, a spacer layer positioned between the first and second ferromagnetic free layers, and a biasing component. The first ferromagnetic free layer has a magnetization ($M_1$) in a first direction, when in a quiescent (non-biased) state. The second ferromagnetic free layer has a magnetization ($M_2$) in a second direction that is anti-parallel to the first direction, when in a quiescent (non biased) state.

14 Claims, 7 Drawing Sheets

U.S. PATENT DOCUMENTS

| | | | |
|---|---|---|---|
| 5,583,725 A | 12/1996 | Coffey et al. | 360/113 |
| 5,616,370 A | 4/1997 | Okuno et al. | 427/547 |
| 5,650,887 A | 7/1997 | Dovek et al. | 360/75 |
| 5,686,838 A | 11/1997 | van den Berg | 324/252 |
| 5,688,605 A | 11/1997 | Iwasaki et al. | 428/611 |
| 5,696,655 A | 12/1997 | Kawano et al. | 360/113 |
| 5,696,656 A | 12/1997 | Gill et al. | 360/113 |
| 5,702,832 A | 12/1997 | Iwasaki et al. | 428/611 |
| 5,705,973 A | 1/1998 | Yuan et al. | 338/32 R |
| 5,717,550 A | 2/1998 | Nepela et al. | 360/113 |
| 5,725,963 A | 3/1998 | Iwasaki et al. | 428/611 |
| 5,738,946 A | 4/1998 | Iwasaki et al. | 428/611 |
| 5,739,988 A * | 4/1998 | Gill | 360/324.12 |
| 5,739,990 A * | 4/1998 | Ravipati et al. | 360/324.12 |
| 5,742,162 A | 4/1998 | Nepela et al. | 324/252 |
| 5,748,524 A | 5/1998 | Chen et al. | 365/173 |
| 5,751,521 A | 5/1998 | Gill | 360/113 |
| 5,756,191 A | 5/1998 | Hashimoto et al. | 428/209 |
| 5,764,056 A | 6/1998 | Mao et al. | 324/252 |
| 5,768,069 A * | 6/1998 | Mauri | 360/314 |
| 5,898,546 A | 4/1999 | Kanai et al. | 360/113 |
| 5,905,611 A | 5/1999 | Yoda et al. | 360/113 |
| 6,055,135 A * | 4/2000 | Fukamichi et al. | 360/324.12 |
| 6,061,211 A * | 5/2000 | Yoda et al. | 360/324.12 |
| 6,084,405 A | 7/2000 | Suzuki | 324/252 |
| 6,169,647 B1 * | 1/2001 | Mao et al. | 360/324.11 |
| 6,449,134 B1 * | 9/2002 | Beach et al. | 360/324.12 |
| 6,500,570 B2 * | 12/2002 | Hasegawa et al. | 428/692 |
| 6,580,270 B1 * | 6/2003 | Coehoorn | 324/252 |

* cited by examiner

GIANT MAGNETORESISTIVE SENSOR HAVING SELFCONSISTENT DEMAGNETIZATION FIELDS

CROSS-REFERENCE TO RELATED APPLICATION

This application claims priority to U.S. Provisional Application No. 60/233,815 filed Sep. 19, 2000 by Lujun Chen, Jim Giusti and Juan Fernandez-de-Castro, and entitled "NEW MR READER STRUCTURES BASED ON STRAY & DEMAG FIELDS WITH DOWNWARD EXTERNAL FIELD" and is also a continuation of International Application Number PCT/US01/13417, filed on Apr. 26, 2001 for "GIANT MAGNETORESISTIVE SENSOR HAVING SELF-CONSISTENT DEMAGNETIZATION FIELDS," which in turn claims priority to the aforementioned U.S. provisional application.

FIELD OF THE INVENTION

The present invention relates to data storage systems. More specifically, the present invention relates to spin valve sensors for use in data storage systems that is adapted to produce the giant magnetoresistive (GMR) effect in response to an applied magnetic field.

BACKGROUND OF THE INVENTION

Giant magnetoresistive (GMR) sensors are employed in read heads of magnetic data storage devices to read data recorded on a recording medium, such as a rotating disk. The data are recorded as magnetic domains in the recording medium. As the data moves past the head, the data causes changes in magnetic flux to the head. These changes in the magnetic flux in the head causes changes in the electrical impedance of the GMR sensor, which are detected by applying a bias or sense current through the sensor and detecting changes in the voltage drop across the sensor. As a result, the changing voltage across the sensor is representative of the data recorded on the recording medium.

Typical magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction by an adjacent anti-ferromagnetic layer, commonly referred to as the "pinning layer" through an anti-ferromagnetic exchange coupling. The other ferromagnetic layer is called the "free" or "unpinned" layer because the magnetization is allowed to rotate in response to the presence of external magnetic fields. The resistivity of the stack varies as a function of the angle between the magnetization of the free or active layer and the magnetization of the pinned layer. Contact layers are attached to the GMR sensor to supply the sense current and permit measurements of the voltage drop across the sensor or its resistance.

Areal data density for a magnetic recording media is the product of the bit density along the length of the recording tracks and the density of those tracks in a direction normal to the track length. As track density increases, track width and spacing decreases, and the areal density increases. The smaller track widths and spacing require read heads with more narrow widths and the ability to prevent side-reading. Side-reading occurs when a magnetic head responds to changing magnetic fields outside the bounds (width) of the head. This side-reading is a source of noise in the recovered data signal, and a source of cross-talk, a phenomenon where the read-head reads data from two or more adjacent tracks. Consequently, the effects of side-reading in a read head is a limiting factor on the spacing between adjacent tracks, and hence a limiting factor to increased areal density.

As the width of the read head becomes smaller to allow for higher recording track densities, demagnetization fields can have a substantial effect on the operation and sensitivity of the GMR sensor. The demagnetization fields are produced by the pinned and free layers due to their magnetic fields which traverse the thin non-ferromagnetic layer that separates them. These demagnetization fields typically have the effect of reducing the change in the relative angle between the magnetization of the pinned and free layers for a given applied magnetic field from the recording medium. As a result, the sensitivity of the GMR sensor is reduced. Additionally, the demagnetization fields can push the biased point in the reader transfer curve of the GMR sensor to its non-linear region creating symmetry and stability problems. For many spin valve sensor designs, the demagnetization fields are a limiting factor to the minimum width of the sensor and thus a limiting factor to the areal density of the data they can reliably read.

Another factor used to determine the maximum areal density of data a spin valve sensor is capable of reading is the length of a transducing read gap (in the direction of track length) of the spin valve sensor. The spin valve sensor is designed such that the length of the transducing read gap is not more than the length of a single flux element, corresponding to a bit of data, on the track. Successive flux elements are recorded in opposite magnetic orientation along the track length, so that by limiting the length of the transducing gap to that of a single flux element, two or more successive flux elements are not read simultaneously, which could lead to their cancellation. As a result, it is desirable to minimize the transducing read gap or the shield-to-shield spacing between the bottom and top shields of the spin valve sensor in order to maximize the areal density of data that the spin valve sensor is capable of reading.

Some spin valve sensors employ permanent magnets abutting opposite sides of the magnetoresistive elements of the sensor stack. These heads are generally referred to as "abutted-junction" magnetoresistive and GMR heads. As mentioned above, usually the head is formed by forming the magnetoresistive elements or sensor stack on a planar bottom shield and thereafter forming the permanent magnet and contact layers. The height configurations of the permanent magnet and contact layers often require that the top shield, positioned opposite the bottom shield, be of varying distance from the bottom shield. More particularly, the thickness of the permanent magnet in contact layers together are often greater than the thickness of the sensor stack. As a result, the spacing between the top and bottom shields increases (along the track length) outside the width of the sensor stack. This increase in spacing between the top and bottom shield can cause the spin valve to read multiple flux elements thereby resulting in a canceling effect on the read signal.

There exists a continuing demand for increased areal densities in magnetic data storage systems. To accommodate this demand, advancements in GMR sensor design are required in the areas of reducing the negative effects of demagnetization fields and improving shield-to-shield spacing.

SUMMARY OF THE INVENTION

The present invention is directed to a spin valve sensor for use in a data storage system, that is adapted to receive a sense current and produce a GMR effect in response to applied magnetic fields. The spin valve sensor includes first and second ferromagnetic free layers, a spacer layer positioned between the first and second ferromagnetic free layers, and a biasing component. The first ferromagnetic free layer has a magnetization ($M_1$) in a first direction, when in a quiescent state. The second ferromagnetic free layer has a magnetization ($M_2$) in a second direction that is anti-parallel to the first direction, when in a quiescent (non-biased) state.

The biasing component produces a bias magnetization field that biases both $M_1$ and $M_2$ in a third direction that is transverse to the first and second directions and establishes quiescent bias states for $M_1$ and $M_2$. The magnetizations $M_1$ and $M_2$ are allowed to rotate about their quiescent bias states in response to an applied magnetic field. This rotation produces a GMR effect in the sensor as a function of the rotation of $M_1$ and $M_2$.

Additional aspects of the present invention are directed to a method of sensing an applied magnetic field using the GMR effect. In the method, a first ferromagnetic free layer is provided having a magnetization $M_1$ in a first direction, when in a quiescent state. Next, a second ferromagnetic layer is provided having a magnetization $M_2$ in a second direction, when in a quiescent state. A bias magnetic field is applied to the first and second ferromagnetic layers thereby directing $M_1$ and $M_2$ toward a third direction that is transverse to the first and second directions thereby establishing quiescent bias state for $M_1$ and $M_2$. Finally, $M_1$ and $M_2$ are allowed to rotate about their quiescent bias states in response to an applied magnetic field whereby the desired GMR effect is produced as a function of the rotation of $M_1$ and $M_2$.

DETAILED DESCRIPTION OF ILLUSTRATIVE EMBODIMENTS

The present invention relates to magnetoresistive sensors of the giant magnetoresistive (GMR) or spin valve type which are used to read back information from recording media, such as magnetic discs. It is desirable that spin valve sensors be capable of reading high areal density data recordings (on the order of 100 Gb/In$^2$). It is necessary that the spin valve sensor be reduced in size in order to allow it to function with such high areal densities. One cost to the reduction in spin valve sensor size is the increased effect that demagnetization fields play in its operation. In particular, the demagnetization fields that would develop in typical spin valve sensor designs that have been sufficiently reduced in size would undesirably decrease the sensitivity of the spin valve sensor to applied to magnetic fields from the magnetic recording media. However, the present invention converts these demagnetization fields from a detriment into a benefit.

The spin valve sensor of the present invention includes two ferromagnetic free layers having magnetization vectors which are aligned in a longitudinal direction that is parallel to an air bearing surface (ABS) and aligned with a sensor or bias current, when in a quiescent state. The quiescent or non-biased state refers to the state the magnetization vectors are in when no external magnetic fields are applied. As a result of the configuration of the spin valve sensor, the magnetization vectors of the ferromagnetic layers are arranged such that the demagnetization or stray fields produced thereby bias each other in a direction that is consistent with the direction of the magnetization vectors when in their quiescent state. A biasing component of the spin valve sensor applies a magnetic field to the ferromagnetic layers to establish an operating point for the spin valve and quiescent bias points for the magnetization vectors, where they are oriented approximately 90° apart. The biasing component of the spin valve can be formed using a permanent magnet positioned above the ferromagnetic layers or using antiferromagnetic layers that are exchange coupled to the ferromagnetic layers. In the presence of an applied magnetic field, the quiescent bias points of the magnetization vectors of the ferromagnetic free layers rotate such that the angle separating them either increases or decreases thereby providing the desired GMR effect.

Figure 1:
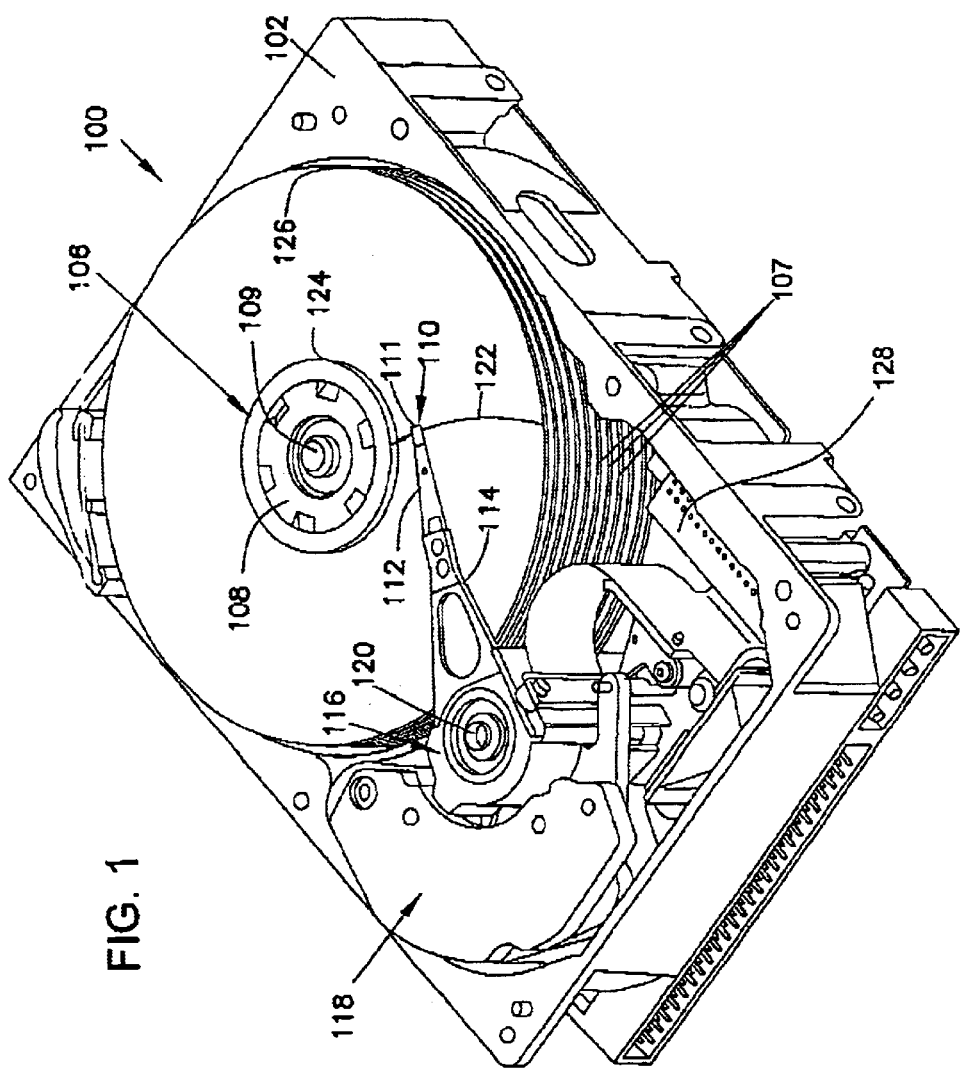
FIG. 1 is a perspective view of a data storage system illustrating an environment in which the spin valve sensor and the method of sensing an applied magnetic field of the present invention can be used.

FIG. 1 is a perspective view of an example of a data storage system, shown as disc drive 100, with which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs 107, which are mounted for co-rotation about central axis 109. Each disc surface has an associated disc head-slider 110 that is mounted to disc drive 100 for communication with the confronting disc surface. Head-slider 110 includes a slider structure arranged to fly above the associated disc surface of an individual disc 107, and a transducing head 111 having write and read portions that are arranged to respectively write data to, and read data from, concentric data tracks on the confronting disc surface. Head 111 includes an air bearing surface that confronts disc 107 and supports head 111 above the disc surface when the disc 107 is rotated.

In the data storage system example shown in FIG. 1, head-sliders 110 are supported by suspensions 112 which are in turn attached to track accessing arms 114 of an actuator 116. Actuator 116 is driven by a voice coil motor (VCM) 118 to rotate actuator 116, and its attached head-sliders 110, about a pivot shaft 120. Rotation of actuator 116 moves head-sliders 110 along an arcuate path 122 to position heads 111 over a desired data track between a disc inner diameter 124 and a disc outer diameter 126. VCM 118 is driven by servo electronics included on circuit board 128 based on signals generated by heads 111 of head-sliders 110 and a host computer (not shown). Read and write electronics are also included on circuit board 128 to supply signals to the host computer based on data read from disc pack 106 by the read portions of heads 111, and to supply write signals to the write portions of head 111 to write data to the discs 107.

Figure 2:
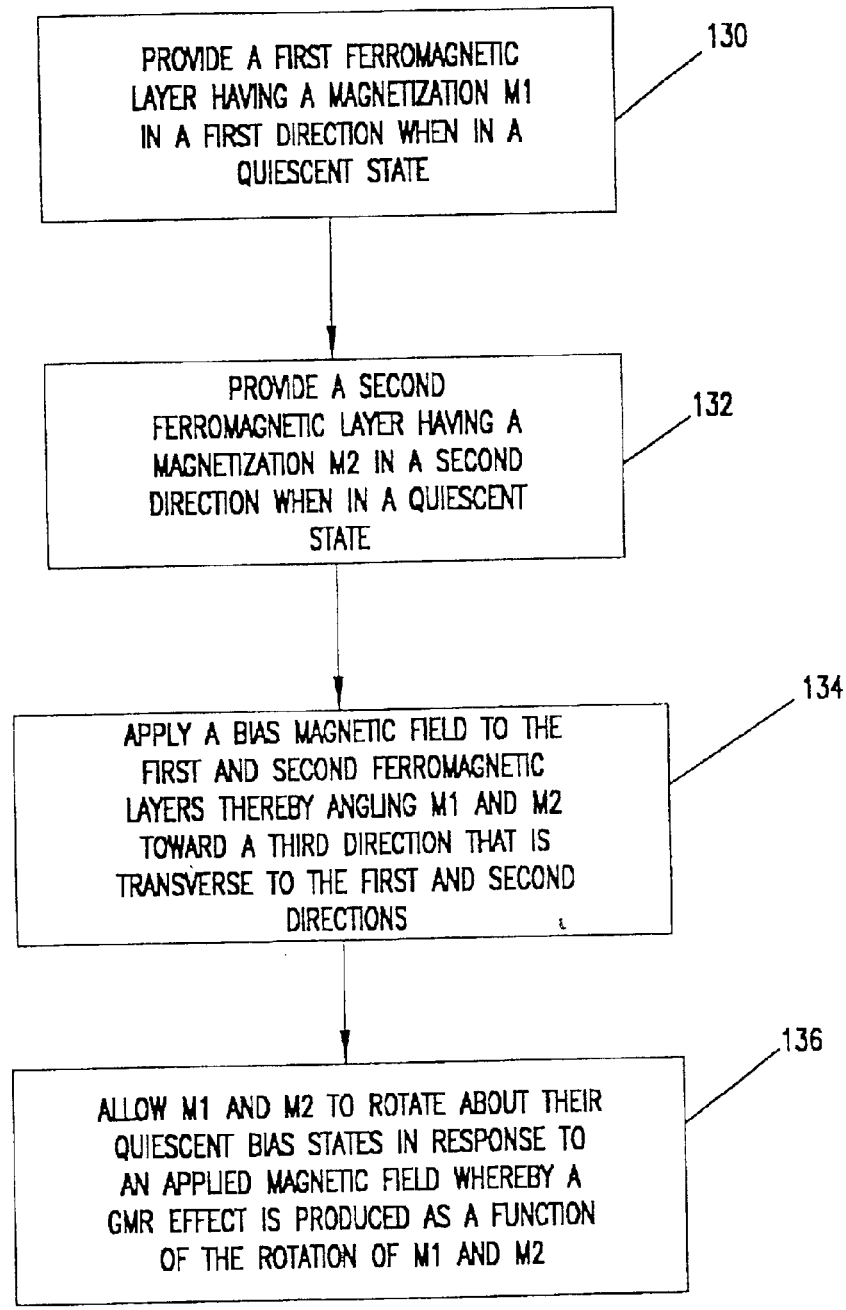
FIG. 2 is a flow chart illustrating the method of the present invention of sensing an applied magnetic field in accordance with the present invention.

The present invention provides a method and a spin valve sensor for sensing an applied magnetic field from a magnetic recording media, such as a disc 107 of disc drive storage system 100 (FIG. 1) using the GMR effect. The general method of the present invention is illustrated in the flowchart of FIG. 2. At step 130, a first ferromagnetic layer is provided having a magnetization ($M_1$) in a first direction when in a quiescent state. At step 132, a second ferromagnetic layer is provided having a magnetization $M_2$ in a second direction when in a quiescent state. The first and second directions are anti-parallel. As will be explained in more detail below, this configuration causes the demagnetization fields produced by the magnetizations $M_1$ and $M_2$ to bias each other in a direction that is consistent with their quiescent states making the arrangement stable. Next, at step 134, a bias magnetization field is applied to the first and second ferromagnetic layers thereby angling the magnetizations $M_1$ and $M_2$ toward a third direction that is transverse to the first and second directions. The bias magnetization field establishes a quiescent bias state for the magnetizations $M_1$ and $M_2$. Finally, at step 136, the first and second magnetizations $M_1$ and $M_2$ are allowed to rotate about their quiescent bias states in response to an applied magnetic field whereby a GMR effect is produced as a function of the rotation of the magnetizations $M_1$ and $M_2$. The GMR effect can then be sensed to determine the polarity of the applied magnetic field.

Figure 3:
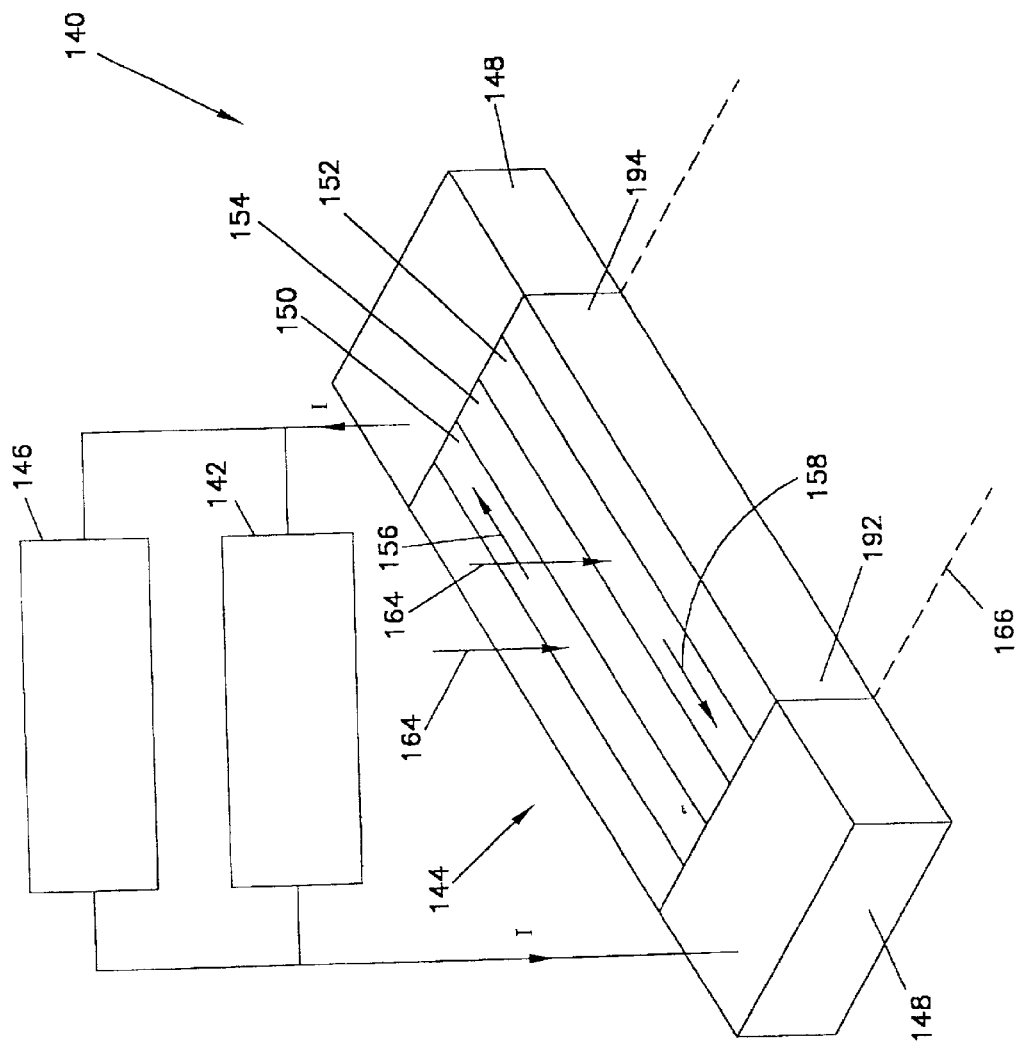
FIG. 3 is a simplified diagram of a spin valve sensor for use with a data storage system, in accordance with embodiments of the present invention.

FIG. 3 shows a simplified diagram of a spin valve sensor 140 for use with a data storage system, such as disc drive 100 (FIG. 1), in accordance with various embodiments of the present invention. Spin valve 140 operates by receiving a sense (or bias) current (I) from a current source 142. Variations in a magnetic field applied to spin valve 140 from, for example, a confronting disc 107 (FIG. 1), cause a change in the electrical resistance of sensor stack 144 of spin valve sensor 140. This change in the electrical resistance of sensor stack 144, known as a GMR effect, can be detected with read back electronics 146 which responsively provides a data output.

Spin valve sensor 140 is generally adapted for high areal density magnetic data recordings, such as those around 100 Gb/In$^2$ and above. Spin valve sensor 140 generally includes sensor stack 144, contacts 148, and a biasing component (not shown). Sensor stack 144 includes first and second ferromagnetic free layers 150 and 152, respectively, separated by an electrically conducting non-magnetic spacer layer 154. The first and second ferromagnetic free layers 150 and 152 have anti-parallel magnetizations $M_1$ and $M_2$, which are represented by magnetization vectors 156 and 158, respectively. Magnetization vector 156 of first ferromagnetic free layer 150 is oriented in a first direction that is anti-parallel to the second direction in which second magnetization vector 158 of the second ferromagnetic free layer 152 is oriented. The first direction is generally aligned in a longitudinal direction in which sense current I travels through sensor stack 144 and which is generally parallel to an air bearing surface (ABS) 166 of spin valve sensor 140. The first and second magnetization vectors 156 and 158 are established in accordance with the shape anisotropy of first and second ferromagnetic free layers 150 and 152. As a result, the first and second magnetization vectors 156 and 158 are oriented in the first and second directions when in their quiescent states.

Figure 4:
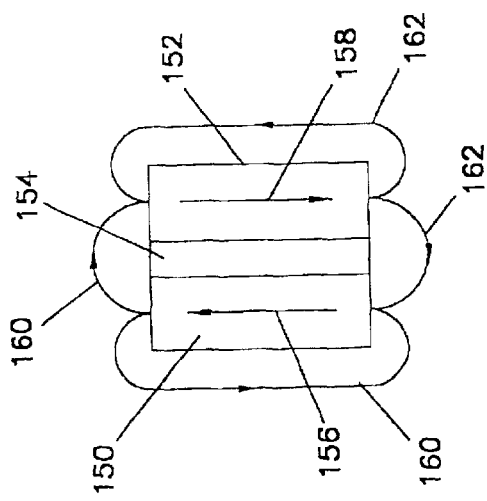
FIG. 4 is a simplified top view of a portion of a sensor stack of a spin valve sensor, in accordance with the present invention, illustrating the effects of demagnetization fields on the quiescent state of the magnetizations of first and second ferromagnetic free layers.

Due to the small size of spin valve 140, the demagnetization or stray fields produced by the magnetization of first and second ferromagnetic free layers 150 and 152 play a dominant role in the operation of spin valve sensor 140. FIG. 4 is a simplified top view of a portion of sensor stack 144 that will be used to illustrate the effects the demagnetization fields produced by the first and second magnetizations $M_1$ and $M_2$ of first and second ferromagnetic free layers 150 and 152 have on each other. A demagnetization or stray field 160 produced by magnetization $M_1$ of first free ferromagnetic layer 150 biases magnetization $M_2$ in the second direction indicated by second magnetization vector 158. Similarly, the second magnetization $M_2$ of second ferromagnetic free layer 152 produces a demagnetization field 162 that biases first magnetization $M_1$ in the first direction indicated by first magnetization vector 156. As a result, the first and second magnetizations $M_1$ and $M_2$ produce demagnetization fields 160 and 162, respectively, which bias each other in a manner that is consistent with their quiescent states. As a result, the quiescent states of first and second magnetizations $M_1$ and $M_2$ are very stable.

The first and second ferromagnetic free layers 150 and 152 can be formed of a single cobalt iron (CoFe) layer, a layer of CoFe and a layer of nickel iron (NiFe), layers of a synthetic anti-ferromagnetic material with some smaller interlayer coupling (preferably −100 to −500 oersted (Oe)), or other materials understood by those skilled in the art to be suitable for forming first and second ferromagnetic free layers 150 and 152. Spacer layer 154 can be formed of copper (Cu) or other suitable electrically conducting non-magnetic material. Preferably, the material forming spacer layer 154 has a negative exchange coupling of about −10 to −70 Oe to improve stability.

The biasing component has a magnetization that produces a magnetic field in a third direction, indicated by arrows 164, which is transverse to the first and second directions indicated by first and second magnetization vectors 156 and 158, shown in FIG. 3. The magnetic field produced by the biasing component can be directed downward as shown in FIG. 3, or upward. Spin valve 140 operates substantially in the same manner for each direction of the bias magnetic field produced by the biasing component. However, the downward direction for the bias magnetic field is generally preferred due to slightly better sensitivity to applied magnetic fields. The effect of the biasing component is to direct the first and second magnetizations $M_1$ and $M_2$ of the first and second ferromagnetic layers 150 and 152 toward the third direction 164 to establish a quiescent bias state, such as that shown in the diagram of FIG. 5.

Figure 5:
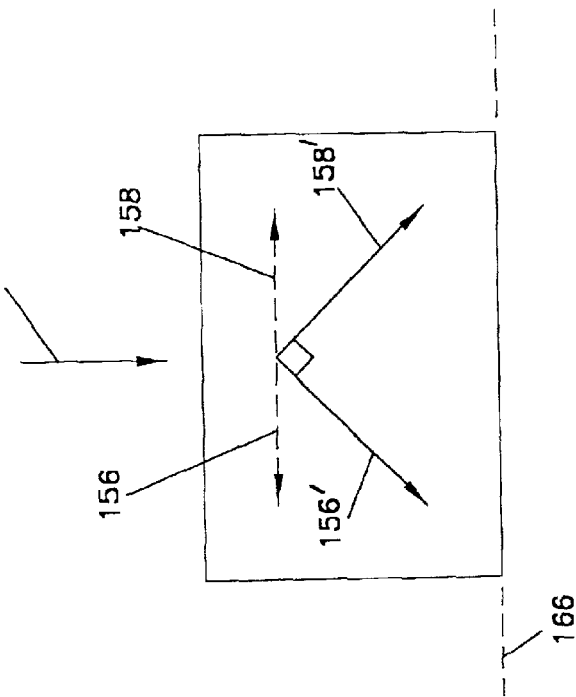
FIG. 5 is a diagram showing magnetization vectors in layers of a spin valve sensor in accordance with an embodiment of the present invention.

FIG. 5 shows first and second magnetization vectors 156 and 158 when in their quiescent states and first and second magnetization vectors 156' and 158' when in their quiescent bias states. Here, the third direction of the bias magnetic field 164 produced by the biasing component is shown as being directed downward toward ABS 166. Alternatively, as mentioned above, the third direction can be directed upward away from ABS 166. As shown in FIG. 5, the application of the bias magnetic field 164 to first and second magnetization vectors 156 and 158 has the effect of rotating first and second magnetization vectors 156 and 158 in the third direction. In a preferred embodiment, the quiescent bias states of first and second magnetization vectors 156' and 158' are angled at approximately 45° from their horizontally oriented quiescent states 156 and 158, and oriented at 90° from each other to form the operating point of spin valve sensor 140 having the best symmetry. However, other operating points are acceptable as well.

As spin valve 140 is carried across the recording media, the magnetic fields produced by the stored magnetic transitions on the recording media cause first and second magnetization vectors 156' and 158' to "flap" like wings. As a result, the angle between first and second magnetization vectors 156' and 158' increases and decreases in response to the applied magnetic fields thereby producing the desired GMR effect in spin valve sensor 140 that is detectable by read electronics 146 (FIG. 3).

Figure 6:
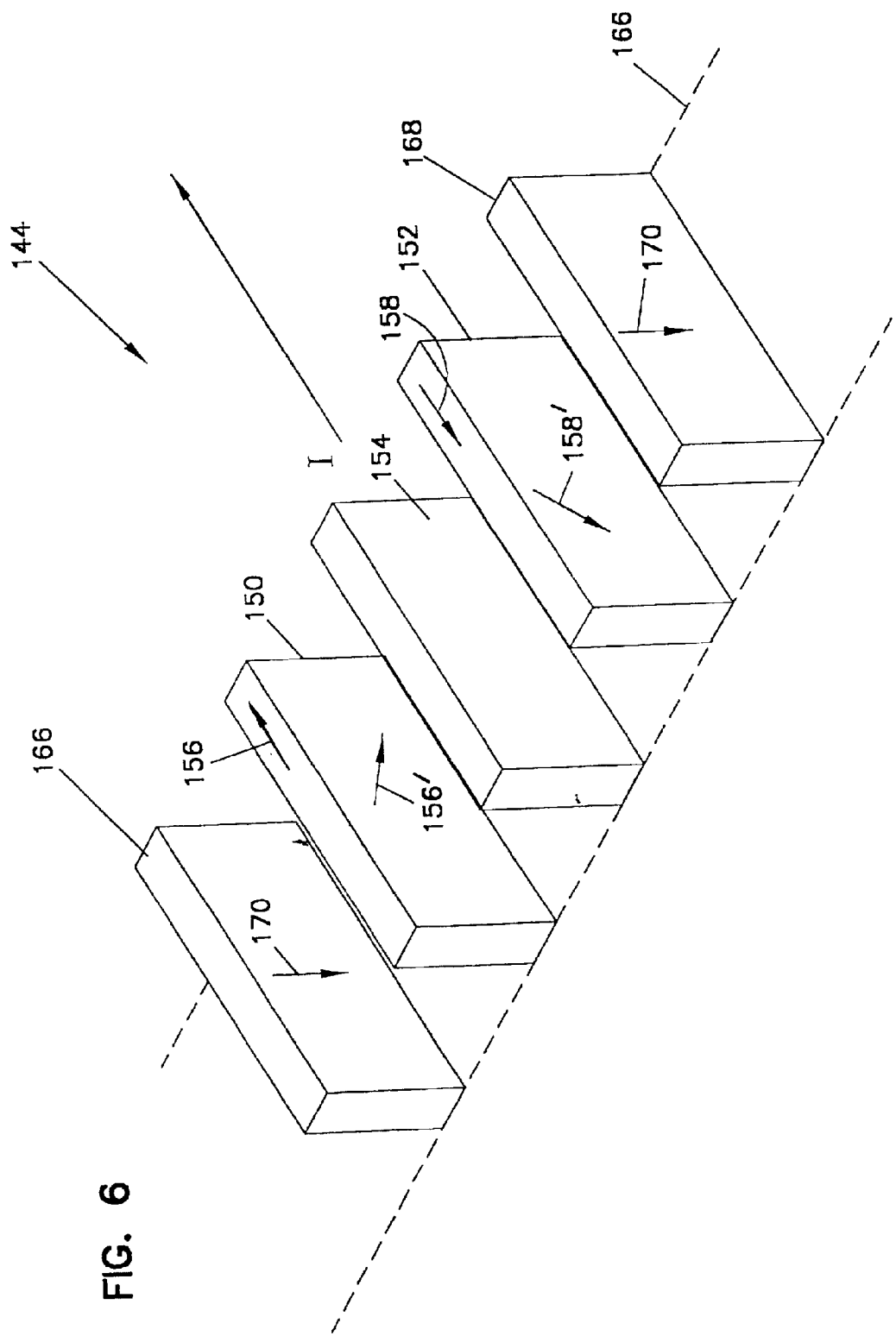
FIG. 6 is an exploded perspective view of a sensor stack of a spin valve sensor, in accordance with an embodiment of the invention.

In one embodiment of the invention, the biasing component is formed by a pair of anti-ferromagnetic (AFM) layers 166 and 168 that are exchanged coupled to first and second ferromagnetic free layers 156 and 158, respectively, as shown in the exploded perspective view of sensor stack 144 of FIG. 6. The first and second AFM layers 166 and 168 provide interlayer exchanging that biases first and second ferromagnetic free layers 156 and 158 in the third direction as indicated by vectors 170 to produce the desired bias magnetic field 164 (FIG. 5) and place the first and second magnetizations $M_1$ and $M_2$ in their quiescent bias states, as indicated by first and second magnetization vectors 156' and 158'. Sensor stack 144 of spin valve 140 can include seed or interface layers to assure proper attachment of the various layers and to also control grain size, texture and crystal structure of the magnetic layers as understood by those skilled in the art.

Conventional spin valve designs use a single AFM layer to pin a free layer in one direction and another AFM layer to pin a second free layer in another direction in order to set the desired operating point of the spin valve sensor. This arrangement requires that the AFM layers be formed of different materials each having a different anneal temperature to allow their exchange pinning or biasing fields to be set in different directions. Typically, the AFM layer having the higher anneal temperature is set first followed by the setting of the AFM layer having the lower anneal temperature. The present invention avoids this two-step process and allows each of the AFM layers to be formed of the same material, since they have exchange pinning or biasing fields that are both oriented in the third direction. Thus, one benefit of this embodiment of spin valve sensor 140 is that it is easier to manufacture than conventional spin valve designs.

Figure 7:
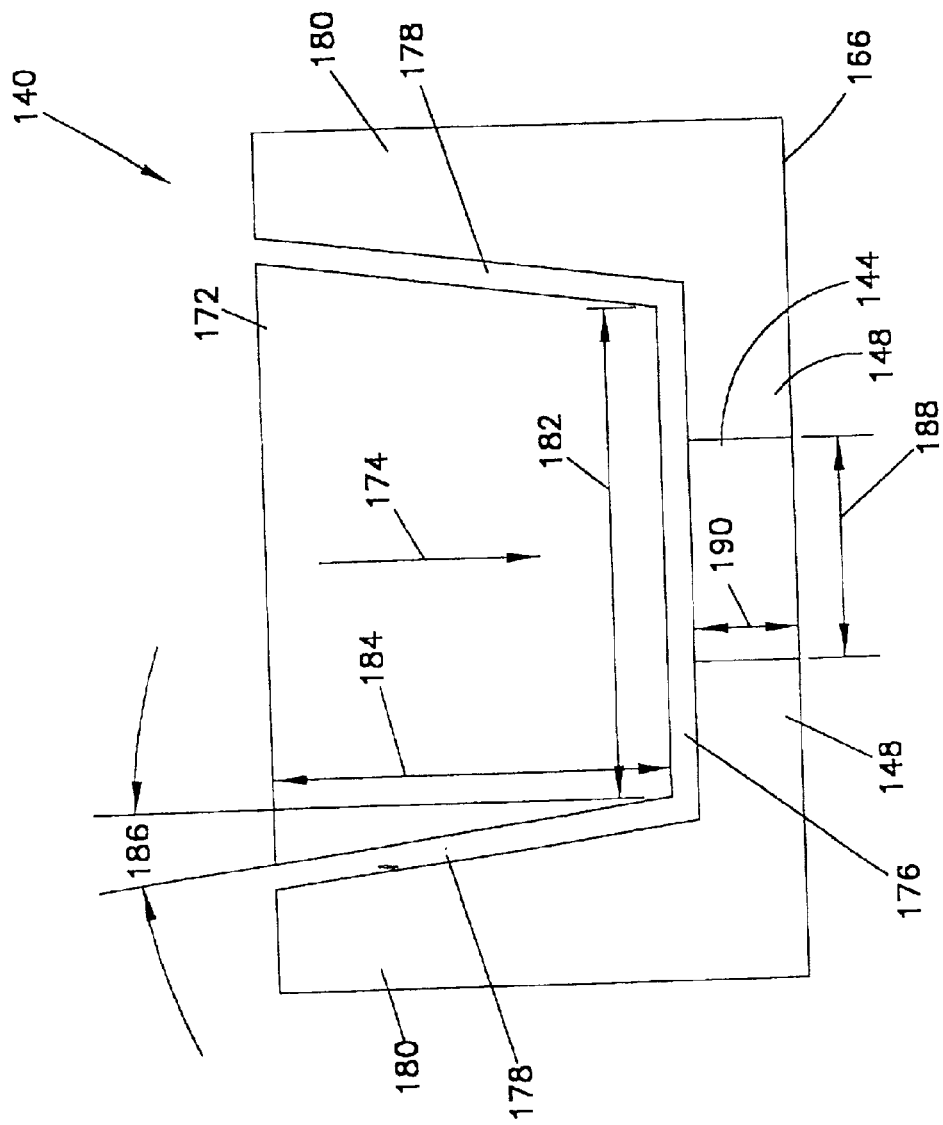
FIG. 7 is a side cross-sectional view of a spin valve sensor taken along a longitudinal direction, in accordance with an embodiment of the invention.

In another embodiment of the invention, the biasing component is formed by placing a permanent magnet 172 above the sensor stack 144, as shown in FIG. 7, which is a side cross-sectional view of a spin valve 140 taken along the longitudinal direction. Permanent magnet 172 has a magnetization that is in the third direction (downward for this example) as indicated by magnetization vector 174. The magnetization of permanent magnet 172 applies the desired bias magnetic field 164 (FIG. 5) to first and second ferromagnetic free layers 150 and 152 (FIG. 3) of sensor stack 144. Permanent magnet 172 is separated from sensor stack 144 and contacts 148 by a back gap or insulating layer 176. Back side gaps or insulating layers 178 separate the sides of permanent magnet 172 from contacts 148 and side shields 180. The gap layers 176 and 178 are formed of an insulating material having a suitable thickness to prevent electric static discharge between permanent magnet 172 and contacts 148, sensor stack 144, and side shields 180.

The strength of the bias magnetic field 164 generated by permanent magnet 172 can be controlled as desired to set the operating point (angle between first and second magnetization vectors 156' and 158') for spin valve 140 by the adjustment of one or more parameters. These parameters include width 182, height 184, depth, magnetic strength, and edge angle 186 of permanent magnet 172. Additional parameters that effect the bias magnetic field generated by permanent magnet 172 include the thicknesses of the back and side gaps 176 and 178. Width 182 is preferably larger than width 188 of sensor stack 144. Width 188 and height 190 of sensor stack 144 are generally below 0.15 micrometers ($\mu$m) to accommodate the high areal density recordings with which spin valve sensor 140 is to be used. Height 184 of permanent magnet 172 is preferably at least 0.5 $\mu$m so that a negative charge in permanent magnet 172 has a smaller effect on the sensor stack 144.

Figure 8:
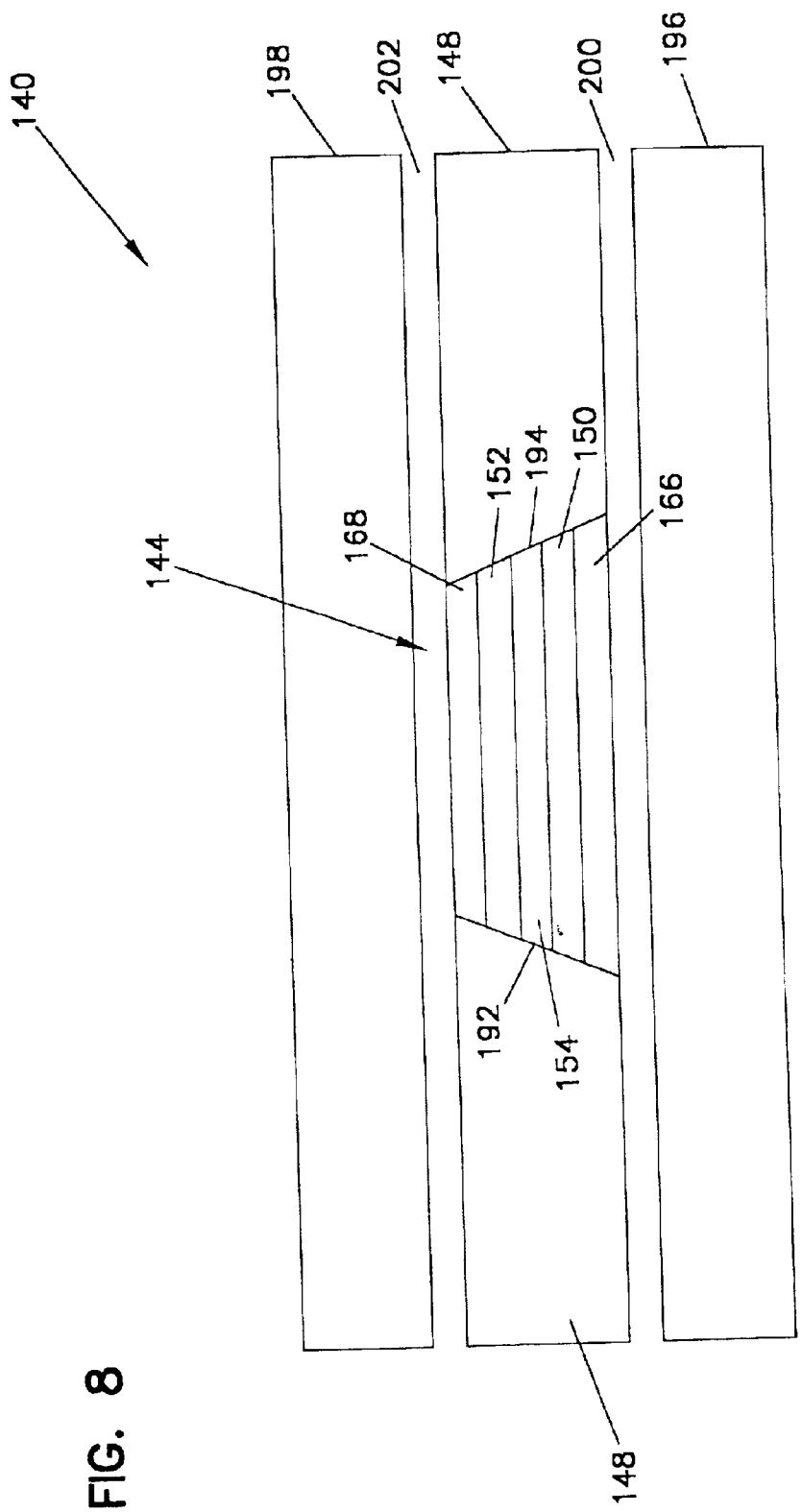
FIG. 8 is an air bearing surface view of a spin valve sensor in accordance with the present invention.

Another aspect of the present invention relates to the placement of contacts 148 at first and second ends 192 and 194 of sensor stack 144, as shown in FIGS. 3 and 8. This arrangement replaces the abutted-junction design of spin valves of the prior art, where permanent magnets were located adjacent the sensor stack with contact layers positioned thereabove. This aspect of the present invention has at least two advantages over the abutted-junction designs. First, by placing contacts 148 in direct contact with the elements of sensor stack 144, the lead resistance is lowered as compared to the abutted-junction design where the sense current was forced to travel through the permanent magnets. Second, by eliminating the permanent magnets at first and second ends 192 and 194, the transducing read gap or shield-to-shield spacing of spin valve 140, defined as the distance separating bottom shield 196 from tip shield 198, can be reduced as shown in the air bearing surface view of spin valve 140 of FIG. 8. Additionally, the elimination of the permanent magnets at first and second ends 192 and 194 allows for smaller and more uniform shield-to-shield spacing between bottom shield 196 and top shield 198. This reduction in the shield-to-shield spacing of spin valve 140 allows spin valve 140 to be used to read high areal density data recordings.

The embodiment of the invention in which the biasing component is formed of permanent magnet 172 allows for the smallest shield-to-shield spacing between bottom shield 196 and top shield 198 due to the absence of first and second AFM layers 166 and 168, shown in FIGS. 6 and 8. Additional spacing between bottom shield 196 and 198 is due to gap layer 200 separating contacts 148 and sensor stack 144 from bottom shield 196 and gap layer 202 separating contacts 148 and sensor stack 144 from top shield 198. By adjusting the thickness of sensor stack 144, contacts 148, gap layer 200 and gap layer 202, spin valve sensor 140 can be optimized for the desired areal density of the data that is to be read.

In summary, one aspect of the present invention relates to a spin valve 140 for receiving a sense current I, which is horizontally oriented in a longitudinal direction corresponding to a width 188 of a sensor stack 144, and having a resistance which changes in response to applied magnetic fields. The spin valve 140 includes first and second ferromagnetic free layers 150 and 152, if a spacer layer 154, and a biasing component. The first ferromagnetic free layer 150 has a quiescent state in which its magnetization $M_1$ (indicated by magnetization vector 156) is in a first direction that is aligned in the longitudinal direction. The second ferromagnetic free layer 152 has a quiescent state in which its magnetization $M_2$ (indicated by magnetization vector 158) is aligned in a second direction that is anti-parallel to the first direction. The magnetization $M_1$ of first ferromagnetic free layer 150 generates a first stray field 160 which biases the magnetization $M_2$ of the second ferromagnetic free later 152 in the second direction. Similarly, the second magnetization $M_2$ of the second ferromagnetic free layer 152 generates a second demagnetization field 162 which biases the first magnetization $M_1$ in the first direction. The spacer layer 154 separates the first and second ferromagnetic free layers 150 and 152. The biasing component produces a bias magnetization field 164 that biases both first and second magnetizations $M_1$ and $M_2$ in a third direction that is transverse to the first and second directions. The biasing component thereby establishes quiescent bias states for the first and second magnetization $M_1$ and $M_2$ as represented by magnetization vectors 156' and 158', respectively.

In one embodiment of spin valve 140, the biasing component is formed of a permanent magnet 172 positioned above the first and second ferromagnetic free layers 150 and 152. In another embodiment, the biasing component is formed of first and second anti-ferromagnetic layers 166 and 168, respectively. The first anti-ferromagnetic layer 166 is exchange coupled to the first ferromagnetic free layer 150 and has a magnetization 170 that is oriented in the third direction.

In another embodiment of the invention, spin valve 140 includes contacts 148 positioned in direct contact with first and second ends 192 and 194, respectively, of the components of sensor stack 144. Spin valve 140 can also include a bottom shield 196 positioned proximate first ferromagnetic free layer 150 and contacts 148, and a top shield 198 positioned proximate the second ferromagnetic free layer 152 and contacts 148. In one aspect of the invention, the bottom and top shields 196 and 198 have a substantially uniform shield-to-shield spacing.

Another aspect of the invention is directed toward a data storage system 100 that includes a spin valve 140 in accordance with the various embodiments of the invention.

The present invention is also directed toward a method of sensing an applied magnetic field. In the method, a first ferromagnetic free layer 150 is provided having a magnetization $M_1$ (represented by magnetization vector 156) in a first direction and aligned with a sense current I that is in a longitudinal direction, when in a quiescent state (step 130). Next, a second ferromagnetic free layer 152 is provided having a magnetization $M_2$ (represented by magnetization vector 158) in a second direction that is anti-parallel to the first direction when in a quiescent state (step 132). The first magnetization $M_1$ generates a first demagnetization field 160 which biases the second magnetization $M_2$ in the second direction, and the second magnetization $M_2$ generates a second demagnetization field 162 that biases the first magnetization $M_1$ in the first direction. Next, a bias magnetic field is applied to the first and second magnetizations $M_1$ and $M_2$, which angles them toward a third direction that is transverse to the first and second directions and establishes a quiescent bias state illustrated by first and second magnetization vectors 156' and 158'. First and second magnetization vectors 156' and 158' are then allowed to rotate about their quiescent bias states in response to an applied magnetic field, whereby a giant magnetoresistive effect is produced as a function of their rotation.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the spin valve sensor while maintaining substantially the same functionality without departing from the scope and spirit of the present invention.

What is claimed is:

1. A spin valve sensor for producing a giant magnetoresistive (GMR) effect on a sense current, which travels in a longitudinal direction, in response to applied magnetic fields, the sensor comprising:
   a first ferromagnetic free layer having a magnetization ($M_1$) in a first direction that is aligned in the longitudinal direction when in a quiescent state;
   a second ferromagnetic free layer having a magnetization ($M_2$) in a second direction that is anti-parallel to the first direction when in a quiescent state;
   a spacer layer between the first and second ferromagnetic free layers; and
   a permanent magnet positioned above the first and second ferromagnetic free layers opposite an air bearing surface (ABS) and producing a bias magnetic field that biases both $M_1$ and $M_2$ in a third direction that is transverse to the first and second directions thereby establishing quiescent bias states for $M_1$ and $M_2$;
   wherein $M_1$ and $M_2$ rotate about their quiescent bias states in response to an applied magnetic field.

2. The spin valve sensor of claim 1, including an insulating layer between the permanent magnet and the first and second ferromagnetic free layers.

3. The spin valve sensor of claim 1, wherein the third direction is selected from a group consisting of downward and upward.

4. The spin valve sensor of claim 1, including first and second contacts respectively positioned in contact with first and second ends of the first and second ferromagnetic free layers and the spacer layer, wherein the sense current is configured to flow between the first and second contacts in the longitudinal direction.

5. The spin valve sensor of claim 4, including:
   a bottom shield proximate the first ferromagnetic free layer and the contacts; and
   a top shield proximate the second ferromagnetic free layer and the contacts.

6. The spin valve sensor of claim 1, wherein $M_1$ and $M_2$ are oriented in a direction that is about 45° relative to the sense current when in their quiescent bias states.

7. A data storage system including a spin valve sensor in accordance with claim 1.

8. A method of sensing an applied magnetic field, comprising steps of:
   (a) providing a first ferromagnetic free layer having a magnetization ($M_1$) in a first direction that is aligned with a sense current (I) in a longitudinal direction, when in a quiescent state;
   (b) providing a second ferromagnetic free layer having a magnetization ($M_2$) in a second direction that is anti-parallel to the first direction, when in a quiescent state;
   (c) applying a bias magnetic field to the first and second ferromagnetic free layers with a biasing component thereby angling $M_1$ and $M_2$ toward a third direction that is transverse to the first and second directions and establishing a quiescent bias state, wherein the biasing component is either a permanent magnet positioned above the first and second ferromagnetic free layers opposite an air bearing surface, or a first anti-ferromagnetic layer exchange coupled to the first ferromagnetic free layer and a second anti-ferromagnetic layer exchange coupled to the second ferromagnetic free layer; and (d) allowing $M_1$ and $M_2$ to rotate about their quiescent bias states in response to an applied magnetic field.

9. A spin valve sensor for producing a giant magnetoresistive (GMR) effect on a sense current, which travels in a longitudinal direction, in response to applied magnetic fields, the sensor comprising:

a first ferromagnetic free layer having a magnetization ($M_1$) in a first direction that is aligned in the longitudinal direction when in a quiescent state;

a second ferromagnetic free layer having a magnetization ($M_2$) in a second direction that is anti-parallel to the first direction when in a quiescent state;

a spacer layer between the first and second ferromagnetic free layers;

a biasing component including a first anti-ferromagnetic layer exchange coupled to the first ferromagnetic free layer and a second anti-ferromagnetic layer exchange coupled to the second ferromagnetic free layer, the first and second anti-ferromagnetic layers each producing a bias magnetization field that respectively biases $M_1$ and $M_2$ in a third direction that is transverse to the first and second directions thereby establishing quiescent bias states for $M_1$ and $M_2$; and wherein $M_1$ and $M_2$ rotate about their quiescent bias states in response to an applied magnetic field thereby producing a GMR effect in the sensor as a function of the rotation of $M_1$ and $M_2$.

10. The spin valve sensor of claim 9, wherein the third direction is selected from a group consisting of downward and upward.

11. The spin valve sensor of claim 9, including first and second contacts respectively positioned in contact with first and second ends of the first and second ferromagnetic free layers and the spacer layer, wherein the sense current flows between the first and second contacts in the longitudinal direction.

12. The spin valve sensor of claim 11, including:

a bottom shield proximate the first ferromagnetic free layer and the contacts; and a top shield proximate the second ferromagnetic free layer and the contacts.

13. The spin valve sensor of claim 9, wherein $M_1$ and $M_2$ are oriented in a direction that is about 45° relative to the sense current when in their quiescent bias states.

14. A data storage system including a spin value sensor in accordance with claim 9.

* * * * *

UNITED STATES PATENT AND TRADEMARK OFFICE
CERTIFICATE OF CORRECTION

PATENT NO. : 6,914,759 B2
DATED : July 5, 2005
INVENTOR(S) : Lujun Chen et al.

It is certified that error appears in the above-identified patent and that said Letters Patent is hereby corrected as shown below:

Column 12,
Line 23, cancel "value" and insert -- valve --.

Signed and Sealed this

Twentieth Day of December, 2005

JON W. DUDAS
*Director of the United States Patent and Trademark Office*